(12) United States Patent
Jang et al.

(10) Patent No.: US 11,705,353 B2
(45) Date of Patent: Jul. 18, 2023

(54) DYNAMIC ROUTING METHOD AND APPARATUS FOR OVERHEAD HOIST TRANSPORT SYSTEM

(71) Applicants: KOREA ADVANCED INSTITUTE OF SCIENCE AND TECHNOLOGY, Daejeon (KR); DAIM Research CO., Ltd., Daejeon (KR)

(72) Inventors: Young Jae Jang, Daejeon (KR); Illhoe Hwang, Seoul (KR); Sangpyo Hong, Seoul (KR)

(73) Assignees: KOREA ADVANCED INSTITUTE OF SCIENCE AND TECHNOLOGY, Daejeon (KR); DAIM Research Co., Ltd., Daejeon (KR)

( * ) Notice: Subject to any disclaimer, the term of this patent is extended or adjusted under 35 U.S.C. 154(b) by 298 days.

(21) Appl. No.: 17/241,878

(22) Filed: Apr. 27, 2021

(65) Prior Publication Data

US 2021/0335630 A1 Oct. 28, 2021

(30) Foreign Application Priority Data

Apr. 28, 2020 (KR) .................. 10-2020-0051448
Feb. 5, 2021 (KR) .................. 10-2021-0017019

(51) Int. Cl.
*H01L 21/677* (2006.01)
*H01L 21/67* (2006.01)
*B65G 1/04* (2006.01)

(52) U.S. Cl.
CPC ........ *H01L 21/6773* (2013.01); *B65G 1/0457* (2013.01); *H01L 21/67259* (2013.01);
(Continued)

(58) Field of Classification Search
CPC .......... H01L 21/6773; H01L 21/67259; H01L 21/67271; H01L 21/67733; H01L 21/67706; B65G 1/0457; B65G 2201/0297
See application file for complete search history.

(56) References Cited

U.S. PATENT DOCUMENTS

| 10,255,785 B1 * | 4/2019 | Huang ............... H01L 21/67724 |
| 2005/0224315 A1 * | 10/2005 | Rice .................. H01J 37/32743 198/463.1 |

(Continued)

FOREIGN PATENT DOCUMENTS

KR 2020088115 * 7/2020 ........... B65G 1/0457

OTHER PUBLICATIONS

Illhoe Hwang & Young Jae Jang, "Q(λ) learning-based dynamic route guidance algorithm for overhead hoist transport systems in semiconductor fabs", International Journal of Production Research, 2020, vol. 58, No. 4, pp. 1199-1221, DOI: 10.1080/00207543.2019. 1614692 (24 pages).

*Primary Examiner* — James R Bidwell
(74) *Attorney, Agent, or Firm* — Sughrue Mion, PLLC (57) ABSTRACT

A dynamic routing method and apparatus for an Overhead Hoist Transport (OHT) system are disclosed. The present disclosure in some embodiments provides a dynamic routing method for an OHT system, including generating a Q table of records of at least one Q value which is a time for a vehicle to move through an edge between two adjacent nodes to a node other than the two adjacent nodes, measuring a transit time of the vehicle when assigned a destination node and passing a transit edge between a current node and next node, extracting target edges to be updated according to the transit time from a plurality of edges, and differentially updating Q values for the target edges according to distances to the transit edge partially based on the transit time, the Q (Continued)

values for the target edges being time values for the vehicle to move through the target edges to the destination node.

20 Claims, 8 Drawing Sheets

(52) U.S. Cl.
CPC .. *H01L 21/67271* (2013.01); *H01L 21/67733* (2013.01); *B65G 2201/0297* (2013.01); *H01L 21/67706* (2013.01)

(56) References Cited

U.S. PATENT DOCUMENTS

| | | | | |
|---|---|---|---|---|
| 2016/0126120 | A1* | 5/2016 | Oza | H01L 21/67733 700/121 |
| 2020/0372427 | A1* | 11/2020 | Nishi | G05D 1/0297 |
| 2021/0202277 | A1* | 7/2021 | Kuo | B65G 47/46 |

* cited by examiner

DYNAMIC ROUTING METHOD AND APPARATUS FOR OVERHEAD HOIST TRANSPORT SYSTEM

CROSS-REFERENCE TO RELATED APPLICATIONS

This application is based on, and claims priority from Korean Patent Application Number 10-2021-0017019 filed Feb. 5, 2021, and Korean Patent Application Number 10-2020-0051448 filed Apr. 28, 2020, the disclosures of which are incorporated by reference herein in their entirety.

TECHNICAL FIELD

The present disclosure in some embodiments relates to a method and apparatus for dynamic routing of an Overhead Hoist Transport (OHT) system. More particularly, the present disclosure relates to an OHT system operating method and apparatus for updating a Q table that is a decision indicator whenever an OHT vehicle passes through an edge between nodes and using the Q table as a basis for providing an OHT vehicle allocation and a routing path.

BACKGROUND

The statements in this section merely provide background information related to the present disclosure and do not necessarily constitute prior art.

A fab representing the latest semiconductor wafer manufacturing facility produces a large volume of wafers with complicated material flow and is equipped with an Automated Material Handling System (AMHS) conducting internal transportation of wafers. The fab implements the AMHS by an Overhead Hoist Transportation (OHT) system. Here, the OHT system is adapted to utilize a guide rail called a track suspended from the facility ceiling and hundreds of vehicles to transport the semiconductor wafers.

Particularly, in a fab producing dynamic random access memory or DRAM chips, the wafer processing steps are repeatedly performed more than 500 times by using thousands of different devices called tools. This means a single wafer being processed over and over by the same tool. Large-scale fabs today are capable of handling 300-mm wafers. Moving between tools, the wafers are loaded into lots called Front Opening Unified Pods (FOUPs), which typically store 20 to 25 wafers. The lots are transported by the OHT system.

Meanwhile, the semiconductor chip market has seen an explosive increase in its size over the past few years toward the digital transformation of almost all industries. These market demands increase the size of the fab and render fab designs to employ an integrated layout in which a single track network connects all the tools. This allows wafers to be transported via the track between the tools so that more wafers can be transported per unit time.

However, the more studies conducted on the integrated layout and direct wafer transfer between tools, the more serious routing issues emerge in transporting the OHT vehicles from tool to tool. As the tool density increases signifying more tools per unit area in the fab, severe congestion of OHT vehicles may occur on the track. This traffic congestion situation degrades the performance of the OHT system, which is measured based on the number of lots delivered during a unit time and the average Delivery time for each lot.

In general, routing methods are classified into static routing and dynamic routing. The static routing is a routing method that invariably maintains a route when determined between a designated start node and a designated destination node. Typical static routing includes deterministic shortest path planning. Conversely, dynamic routing is a route guidance method that dynamically selects an optimal route based on traffic conditions and congestion levels. In other words, the dynamic routing changes routes following traffic conditions. When traffic congestion occurs on the route after the shortest route setting, the dynamic routing method can reset the route to avoid delay.

Current commercial OHT systems often use a static approach with a preset rule for avoiding congestion. Specifically, AMHS engineers use a shortest-path algorithm to determine a pre-planned path of travel from one port to another. Then, while operating the OHT system, real-time congestion is observed to identify the congestion area that occurred. When constant congestion occurs in some specific areas or route sections, the route is corrected directly or indirectly. For example, when moving from node 'i' to node 'j' is the shortest path to the destination node, the OHT vehicles are routed to move to node 'j'. However, when a predetermined OHT vehicle exists between node 'i' and node 'j', the OHT vehicle is routed to move to node 'j' following a preset rule.

However, a routing method based on a preset rule takes a lot of time and requires a lot of field experience of an engineer to proceed with simulations and analyses. As a result, static routing methods are not adaptable quickly to dynamically changing traffic and events. Further, rules cannot be designed with consideration of every patterns of traffics or congestions reflected in advance. It is not a simple matter either to determine a threshold value for determining whether there is congestion. In particular, unexpected machine downtime or OHT failures occur in fabs. When an unexpected event occurs and the OHT vehicle fails to traverse a particular segment of the track, the OHT system needs to recalculate the shortest route to determine an alternate route. It is very cumbersome and inefficient to manually figure out an alternate route whenever an unexpected event occurs.

SUMMARY

According to at least one embodiment, the present disclosure provides a dynamic routing method for an overhead hoist transport (OHT) system, including generating a Q table in which at least one Q value is recorded, which is the time taken for a vehicle to move through an edge between two adjacent nodes to a node other than the two adjacent nodes, measuring a transit time of the vehicle when assigned a destination node and passing a transit edge between a current node and a next node, extracting target edges to be updated according to the transit time from among a plurality of edges, and differentially updating Q values for the target edges according to distances to the transit edge based in part on the transit time, the Q values for the target edges being time values for the vehicle to move through the target edges to the destination node.

According to another embodiment, the present disclosure provides a dynamic routing apparatus for an overhead hoist transport (OHT) system, including a Q-table generation unit, a measuring unit, a target-edge extracting unit, and a Q-table management unit. The Q-table generation unit is configured to generate a Q table in which at least one Q value is recorded, which is a time taken for a vehicle to move through an edge between two adjacent nodes to a node other than the two adjacent nodes. The measuring unit is configured to measure the transit time of the vehicle when assigned a destination node and passing a transit edge between a current node and a next node. The target-edge extracting unit is configured to extract target edges to be updated according to the transit time from among a plurality of edges. The Q-table management unit is configured to differentially update Q values for the target edges according to distances to the transit edge based in part on the transit time, the Q values for the target edges being time values for the vehicle to move through the target edges to the destination node.

| REFERENCE NUMERALS | |
|---|---|
| 200: Q-table generation unit | 210: measurement unit |
| 220: target-edge extraction unit | 230: Q-table management unit |
| 240: receiving unit | 250: vehicle selection unit |
| 260: vehicle control unit | |

DETAILED DESCRIPTION

The present disclosure in some embodiments seeks to provide an operating method and apparatus for dynamic routing of an OHT system, which reduce traffic congestion that occurs due to increases in the number of OHT vehicles and the frequency of transportation requests and speed up the computation required for routing the numerous OHT vehicles.

The present disclosure in some other embodiments seeks to provide a method and apparatus for dynamic routing, which are unlike static routing methods and adaptable in real-time to a malfunction of an OHT vehicle or a hardly predictable OHT vehicle allocation request.

Some exemplary embodiments of the present disclosure are described below with reference to the accompanying drawings. In the following description, like reference numerals preferably designate like elements, although the elements are shown in different drawings. Further, in the following description of some embodiments, a detailed description of known functions and configurations incorporated herein will be omitted for the purpose of clarity and for brevity.

Additionally, various terms such as first, second, A, B, (a), (b), etc., in describing components of the present disclosure are used solely for the purpose of differentiating one component from the other but not to imply or suggest the substances, the order, or sequence of the components. Throughout this specification, when a part "includes" or "comprises" a component, the part is meant to further include other components, not excluding thereof unless there is a particular description contrary thereto. The terms such as "unit," "module," and the like refer to units for processing at least one function or operation, which may be implemented by hardware, software, or a combination thereof.

In the following, the vehicle is described as being a mechanical device composed of a drive unit for transporting wafers and a transfer unit for loading objects in a semiconductor manufacturing facility, but the vehicle is not necessarily limited thereto but refers to a freight vehicle, a container, an OHT vehicle or the like, which may be used interchangeably when referring to the vehicle. Additionally, nodes mean tool locations and intersection points. A route between two adjacent nodes is referred to as an edge which is a path through which the vehicle moves. In other words, the edge may refer to a path or track between two adjacent nodes. The edge may be a bi-directional edge, but in a semiconductor manufacturing facility, it is preferably a uni-directional edge.

Figure 1:
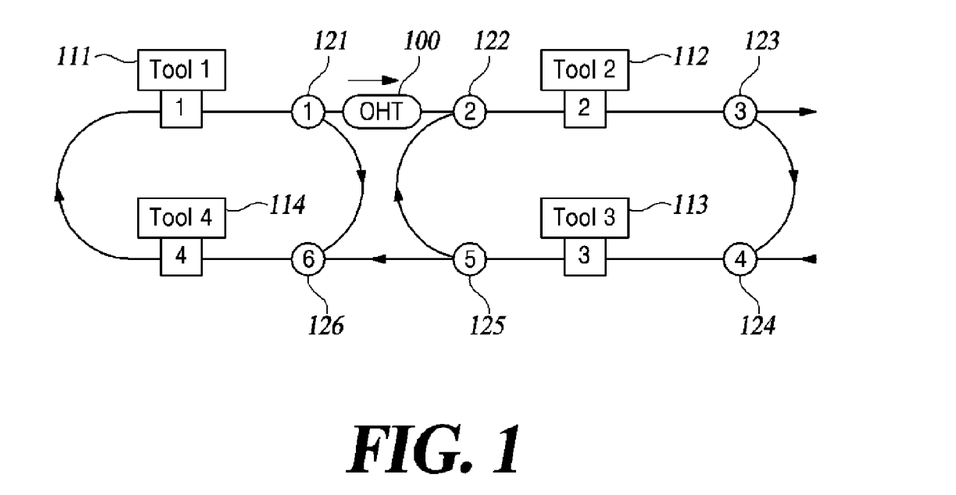
FIG. 1 is a diagram illustrating an Overhead Hoist Transport (OHT) system according to at least one embodiment of the present disclosure.

FIG. 1 is a diagram illustrating an OHT system according to at least one embodiment of the present disclosure.

As shown in FIG. 1, an OHT system (not shown) includes a vehicle 100, a plurality of tools 111, 112, 113, 114, and a plurality of intersections 121, 122, 123, 124, 125, 126. Here, the multiple tools 111, 112, 113, and 114 refer to places where wafer processing is performed. The multiple intersections 121, 122, 123, 124, 125, and 126 refer to points where a route of the vehicle 100 is divided into at least two or routes are merged.

In response to a tool requesting vehicle allocation, the OHT system allocates the tool an idle vehicle among vehicles close to the tool. The vehicle 100 carrying a wafer lot moves along the track to the assigned tool. Thereafter, the vehicle 100 waits in an idle state until the wafer lot completes its processing. Upon completion of the wafer lot processing, the OHT system moves the vehicle 100 loaded with the wafers to a tool corresponding to the next process.

Figure 2:
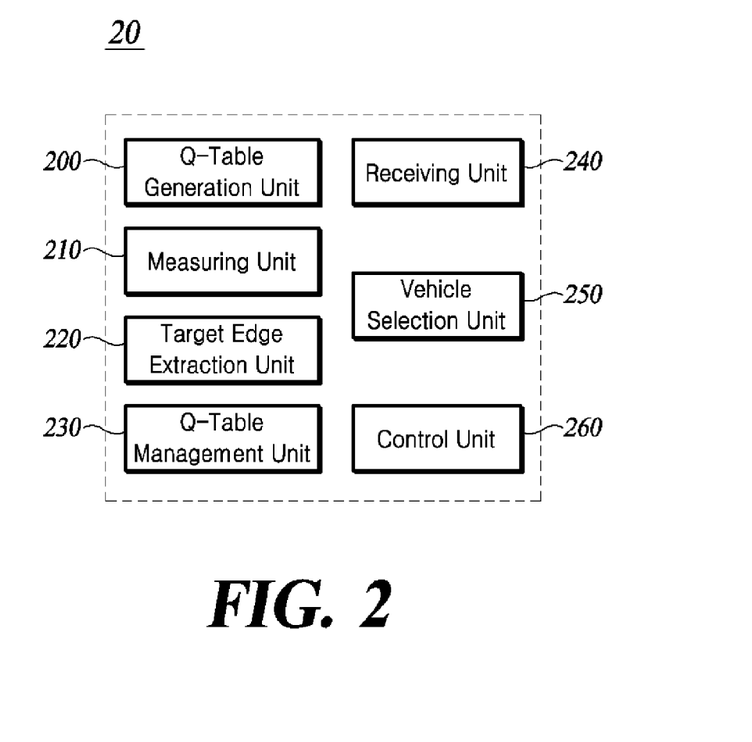
FIG. 2 is a block diagram illustrating the components of a dynamic routing apparatus according to at least one embodiment of the present disclosure.

FIG. 2 is a block diagram illustrating the components of a dynamic routing apparatus 20 according to at least one embodiment of the present disclosure.

As shown in FIG. 2, the dynamic routing apparatus 20 includes a Q-table generation unit 200, a measurement unit 210, a target-edge extraction unit 220, a Q-table management unit 230, a receiving unit 240, a vehicle selection unit 250, and a vehicle control unit 260.

The Q-table generation unit 200 is a component for generating a Q table in which at least one Q value is recorded, which is a time taken for a vehicle to move through an edge between two adjacent nodes to a node other than the two nodes. Here, the Q table may be a three-dimensional or 3D table composed of a start node, an intermediate node, and a destination node. The intermediate node means a node adjacent to the start node. The vehicle moves to the destination node through an edge between the start node and the intermediate node. In a word, a single Q value recorded in the Q table represents the time taken for the vehicle to move through a single edge to a single destination node.

The Q-table generation unit 200 may initialize the Q table. The Q-table generation unit 200 sets all Q values to 0. In a situation where there is no congestion in the OHT system, a vehicle assigned a destination node passes through an edge between a node and the vehicle's adjacent node, and the measurement unit 210 measures the transit time. Here, the situation with no congestion means that there is only one vehicle in the OHT system. The Q-table generation unit 200 calculates the shortest movement time taken for a vehicle to move from its adjacent node to a destination node based on the Q table. The Q-table generation unit 200 may update the Q values based on the transit time and the shortest movement time. The Q-table generation unit 200 may perform initialization for all Q values until a difference between a Q value before the update and a Q value after the update becomes smaller than a preset value. Through this process, the Q-table generation unit 200 may initialize all Q values by performing an initialization operation on all edges and all destination nodes.

The measurement unit 210 is a component for measuring the transit time of the vehicle when assigned the destination node during the OHT system operation and passing the transit edge between the current node and the next node. Here, the current node is a node where the vehicle is located, and the next node is one of the nodes adjacent to the current node.

The target-edge extraction unit 220 is a component for extracting, from a plurality of edges, target edges to be updated based on a transit time. In other words, the target edge means an edge updated in response to a vehicle passing through one edge. Here, according to another embodiment of the present disclosure, the target edges may mean edges filtered from the remaining edges through an additional filtering algorithm.

Specifically, the target-edge extraction unit 220 extracts, from the plurality of edges, the remaining edges as target edges, excluding such edges that can be used for the vehicle to move from the next node to the destination node and excluding the transit edge. In other words, the target edges refer to the edges that are left excluding the transit edge among all edges and further excluding edges that can be used for the vehicle to move from the next node to the destination node.

The Q-table management unit 230 is a component for differentially updating Q values for each target edges according to their distances to the transit edge based in part on the transit time. Here, a distance to the transit edge means the length of tracks or the number of edges that the vehicle can use to move from the target edge to the transit edge. The Q value of the target edge means the time taken for the vehicle to move through the target edge to the destination node. At this time, the Q value may be expressed as Q[(d, i), j]. Here, 'i' denotes a start node, 'j' an adjacent node, and 'd' a destination node. The Q-table management unit 230 updates the Q value for each target edge when the vehicle moves from one node to another node. For example, if there are three target edges, the Q-table management unit 230 update three Q values when the vehicle moves.

Specifically, the Q-table management unit 230 differentially update the Q values partially based on the transit time while adjusting the amount of change in the Q value of the target edge that is closer to the transit edge to be greater than the amount of change in the Q value of the target edge that is farther from the transit edge. Therefore, the greater the target edge distanced from the transit edge, the smaller the amount of change in the Q value. For example, when the transit time is extended due to congestion, the Q value of the target edge closer to the transit edge increases at an even greater rate than the Q value increasing for the target edge that is farther from the transit edge.

This is because of the higher probability of the target edge being associated with the transit time as the target edge is closer to the transit edge. For example, when the transit time is extended due to congestion, a vehicle closer to the congested transit edge has a higher probability that pass the congested transit edge than a vehicle farther to the congested transit edge. In other words, the probability that a vehicle traveled a target edge close to the transit edge to use a congested transit edge is higher than the probability that a vehicle traveled through a target edge far from the transit edge to use a congested transit edge. The Q table management unit takes this into account and updates the Q values differentially.

The Q-table management unit 230 according to at least one embodiment of the present disclosure updates the Q values for the target edges based in part on their distances to the transit edge and a reward according to the movement of the vehicle. The larger the reward, the larger the Q values of the target edges. The greater the distance of a target edge to the transit edge, the smaller the degree to which the reward is applied or reflected in the Q value of the target edge.

Here, the reward refers to a value obtained by adjusting the transit time by a potential difference, which is a difference between a first potential and a second potential calculated by the Q-table management unit 230. Potential refers to the time taken for one vehicle to travel from the start node to the destination node when there are no vehicles on the track. The potential may be preset as a time-invariant value that does not change with time.

Specifically, the Q-table management unit 230 calculates a first potential between the destination node and the current node and a second potential between the destination node and the next node. The Q-table management unit 230 calculates a reward by adjusting the transit time based on the difference between the first potential and the second potential. The Q table management unit 230 updates the Q values for the target edges based in part on the reward. The Q-table management unit 230 according to at least one embodiment of the present disclosure applies or reflects less reward in the Q value of the target edge as the distance increases between the target edge and the transit edge.

The Q-table management unit 230 according to at least one embodiment of the present disclosure also updates the Q values for the target edges by using a temporal difference error (TD error). The TD error is used with temporal difference learning (TD learning) which is a way of reinforcement learning in which an agent uses a reward system given after each action to learn the environment continuously.

The TD error is a value calculated based on a movement time, a reward, and a Q value of a transit edge, and it is a parameter used for updating Q values. Here, the movement time represents a value obtained by calculating, based on the Q table, the shortest time taken for the vehicle to move from the next node to the destination node. The TD error is a value obtained by adjusting reward by the difference between the movement time and the Q value of the transit edge. The Q-table management unit 230 according to at least one embodiment of the present disclosure applies the TD error at a lesser degree in the Q value of the target edge as the distance increases between the target edge and the transit edge.

The receiving unit 240 is a component for receiving a request for vehicle allocation from a vehicle request node.

The vehicle selection unit 250 is a component for selecting an optimal vehicle to transport a wafer lot among a plurality of vehicles based on the updated Q table. The vehicle selection unit 250 according to at least one embodiment of the present disclosure is adapted to calculate estimated movement times for the plurality of vehicles to move to the vehicle request node, respectively, based on the updated Q table, and to select a vehicle with a shortest estimated movement time among the plurality of vehicles as the optimal vehicle. The selected vehicle is an optimal vehicle for serving a wafer lot.

The vehicle control unit 260 is a component for moving the optimal vehicle to the vehicle request node according to the Boltzmann softmax policy. Here, the Boltzmann softmax policy prescribes that, when there is a plurality of routing edges connected to a node where the optimal vehicle is located, the optimal vehicle be moved through one routing edge of the plurality of routing edges based on the probability according to the ratio of the Q values to the plurality of routing edges.

Figure 3A:
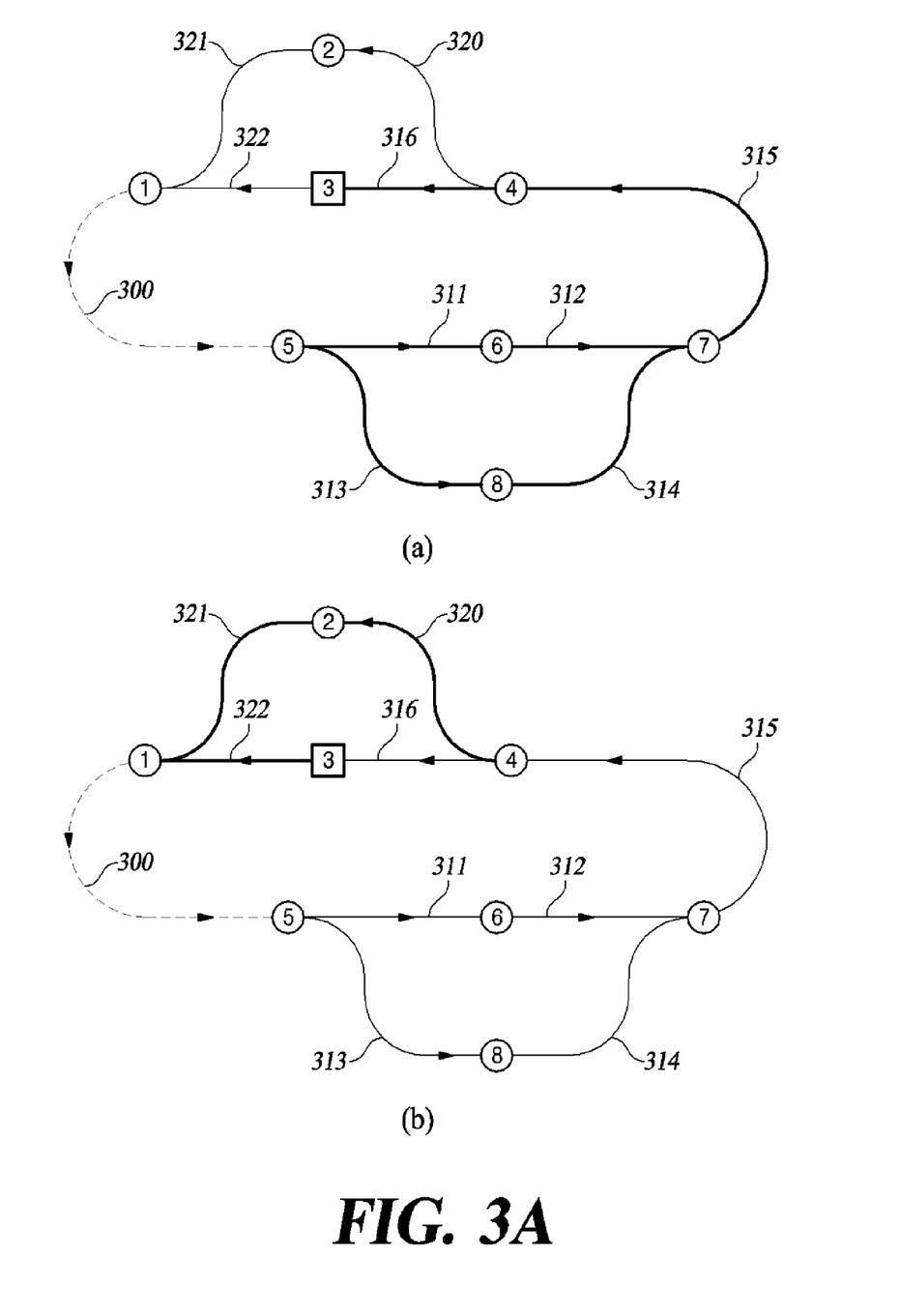
FIGS. 3A and 3B are diagrams of processes of extracting target edges according to some embodiments of the present disclosure.
Figure 3B:
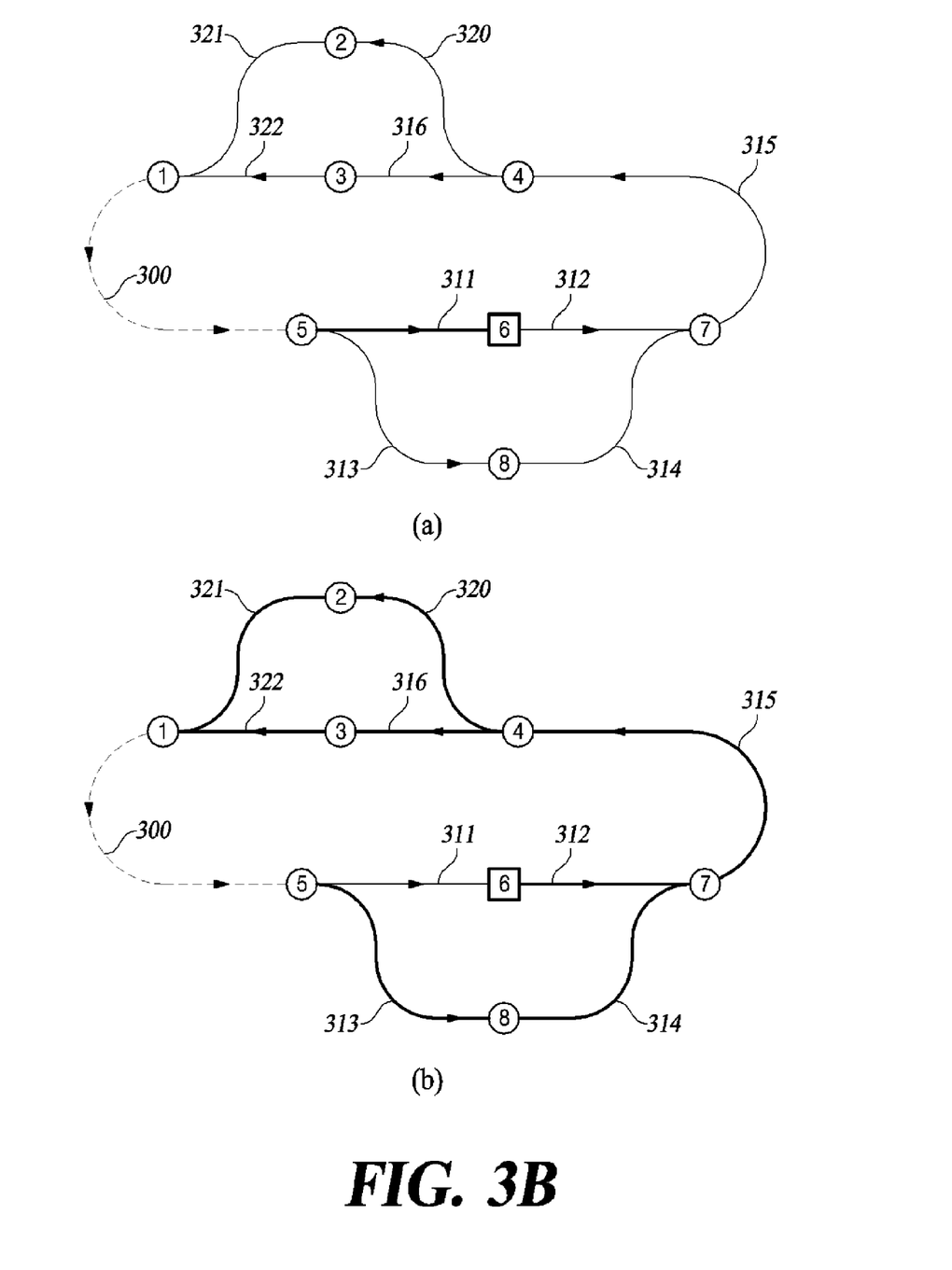

FIGS. 3A and 3B are diagrams of processes of extracting target edges according to some embodiments of the present disclosure.

FIGS. 3A and 3B show a plurality of edges 300, 311, 312, 313, 314, 315, 316, 320, 321, 322, and eight nodes as circled or squared numbers. The vehicle is described as being moved from node 1 to node 5. So, node 1 is the current node where the vehicle is located, and node 5 is the next node adjacent to the current node. Hereinafter, reference for the dynamic routing apparatus is omitted.

As shown in FIG. 3A, the plurality of edges 300, 311, 312, 313, 314, 315, 316, 320, 321, 322 includes a transit edge 300, target edges 320, 321, 322, and the remaining edges or to-go edges 311, 312, 313, 314, 315, 316. In FIG. 3A, node 3 is the destination node.

The transit edge 300 means an edge through which the vehicle has passed. The remaining edges 311, 312, 313, 314, 315, 316 represent edges that can be used for the vehicle to move from the next node to the destination node. The target edges 320, 321, 322 are to be updated based on the transit time of the vehicle, excluding the transit edge 300 and the remaining edges 311, 312, 313, 314, 315, 316 from the plurality of edges 300, 311, 312, 313, 314, 315, 316, 320, 321, 322.

As shown in FIG. 3A at (a), to extract the target edges 320, 321, 322 to be updated after the movement of the vehicle, a dynamic routing apparatus according to some embodiments excludes the transit edge 300 through which the vehicle has passed from among the plurality of edges 300, 311, 312, 313, 314, 315, 316, 320, 321, 322. Thereafter, the dynamic routing apparatus excludes the remaining edges 311, 312, 313, 314, 315, and 316, which can be used for the vehicle to move from node 5 to node 3.

FIG. 3A indicates at (b), target edges 320, 321, and 322 to be updated as the vehicle passes through the transit edge 300.

Through the above-described process, the dynamic routing apparatus may extract target edges 320, 321, and 322.

As shown in FIG. 3B, a plurality of edges 300, 311, 312, 313, 314, 315, 316, 320, 321, 322 includes is a transit edge 300, target edges 312, 313, 314, 315, 316, 320, 321, 322, and a remaining edge 311 to go. In FIG. 3B, node 6 is the destination node.

As shown in FIG. 3B at (a), to extract the target edges 312, 313, 314, 315, 316, 320, 321, 322 to be updated after the movement of the vehicle, the dynamic routing apparatus excludes the transit edge 300 through which the vehicle has passed from among the plurality of edges 300, 311, 312, 313, 314, 315, 316, 320, 321, 322. Thereafter, the dynamic routing apparatus excludes the remaining edge 311 to go, which can be used for the vehicle to move from node 5 to node 6.

FIG. 3B shows at (b), target edges 312, 313, 314, 315, 316, 320, 321, 322 that are to be updated as the vehicle passes through the transit edge 300.

Through the above-described process, the dynamic routing apparatus may extract target edges 312, 313, 314, 315, 316, 320, 321, 322.

The dynamic routing apparatus does not update all Q values every time the vehicle moves, but updates only Q values for target edges every time the vehicle moves from a current node to a adjacent node, thereby reducing computational throughput required to manage the Q table and preventing computational overload. This is called local adaptation.

Figure 4:
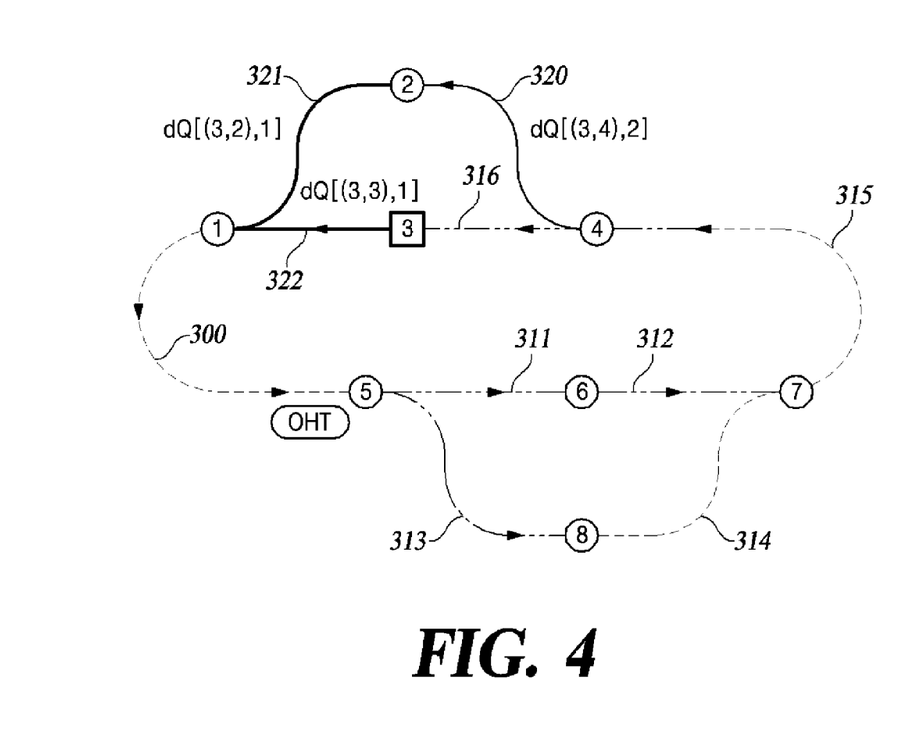
FIG. 4 is a diagram of components for differentially updating Q values based on distances to a transit edge according to at least one embodiment of the present disclosure.

FIG. 4 is a diagram of components for differentially updating Q values based on distances to a transit edge according to at least one embodiment of the present disclosure.

FIGS. 4 and 3A illustrate an OHT vehicle, a plurality of nodes, a transit edge 300, and the amount of change in the Q values for the target edges 320, 321, 322. The target edges 320, 321, 322 include a first target edge 321, a second target edge 322, and a third target edge 320.

The Q value of the first target edge 321 means the shortest time taken for the vehicle to move to node 3 through the first target edge 321. Nodes included in the first target edge 321 are nodes 1 and 2. Accordingly, when the destination node is node 3, the Q value of the first target edge 321 may be expressed as $Q[(3,2), 1]$. When the destination node is node 3, the amount of change in the Q value of the first target edge 321 may be expressed as $dQ[(3,2), 1]$. Likewise, when the destination node is node 3, the Q value of the second target edge 322 and the Q value of the third target edge 320 are expressed as $dQ[(3,3), 1]$ and $dQ[(3,4), 2]$, respectively. The amount of change in the Q values can be calculated based in part on at least one of the reward and TD error. In particular, the dynamic routing apparatus applies at least one of the reward and TD error at a lesser degree in the Q values of the target edges as their distances from the target edges to the transit edge 300 increase.

Since the third target edge 320 is distanced farther from the transit edge 300 than the first target edge 321, the dynamic routing apparatus sets $dQ[(3,4), 2]$ to be smaller than $dQ[(3, 2), 1]$. Additionally, since the third target edge 320 is distanced farther from the transit edge 300 than the second target edge 322, the dynamic routing apparatus sets $dQ[(3,4), 2]$ to be smaller than $dQ[(3,3), 1]$.

Through the above-described process, the dynamic routing apparatus changes the Q values of the target edges that are farther from the transit edge at a lesser degree and changes the Q values of the target edges that are closer to the transit edge at a greater degree, thereby allowing the Q values to be managed precisely and efficiently. This is called a decaying update.

Figure 5A:
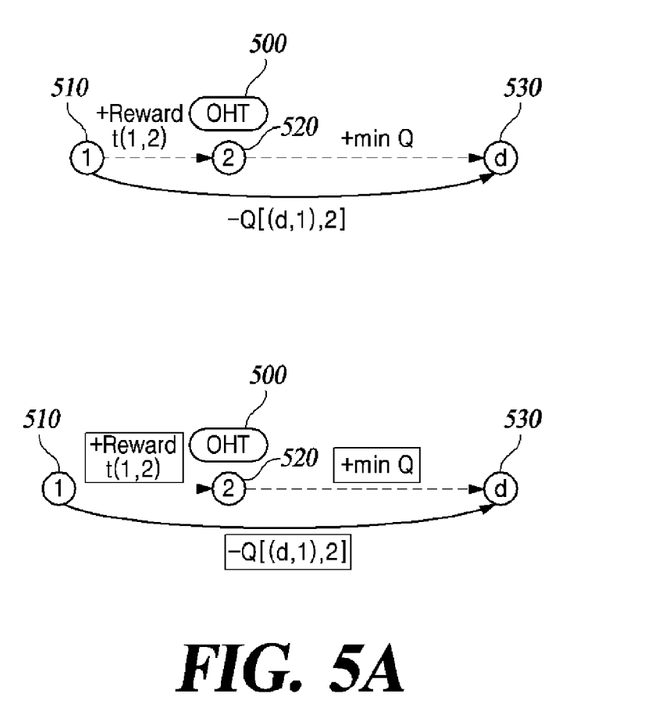
FIGS. 5A and 5B are diagrams of a temporal difference error and a reward according to some embodiments of the present disclosure.
Figure 5B:
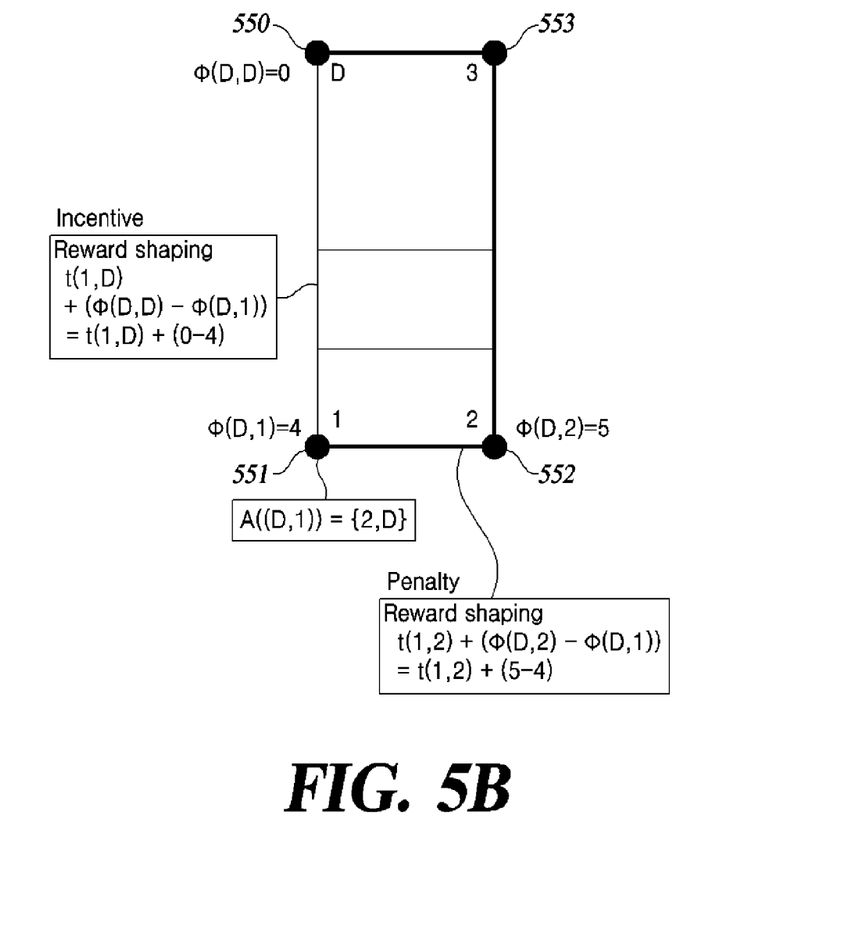

FIGS. 5A and 5B are diagrams of a temporal difference error and a reward according to some embodiments of the present disclosure.

FIG. 5A illustrates a vehicle 500, a current node 510, a next node 520, and a destination node 530. Here, the current node 510 means a start node. The edge between the current node 510 and the next node 520 is the transit edge.

The dynamic routing apparatus calculates a reward for an action that the vehicle 500 moved from the current node 510 to the next node 520. Here, the reward is calculated based in part on the movement time of the vehicle 500.

The dynamic routing apparatus calculates, based on the Q table, min Q which is the shortest movement time taken for the vehicle 500 to move from the next node 520 to the destination node 530. In a case where the next node 520 and the destination node 530 have multiple intermediate routes, the sum of the shortest times for their respective routes may be calculated as min Q.

The dynamic routing apparatus calculates Q[(d,1), 2] based on the Q table as the time taken for the vehicle 500 to move through the edge between the current node 510 and the next node 520 to the destination node 530.

The dynamic routing apparatus may calculate the temporal difference error (TD error) by summing the reward and the movement time min Q and then subtracting therefrom Q value Q[(d,1), 2] of the transit edge.

The TD error may be calculated through Equation 1.

$$\delta(d, i, j) = R[(d, i), j] + \min_k Q[(d, j), k] - Q[(d, i), j] \quad \text{Equation 1}$$

In Equation 1, $\delta(d, i, j)$ is the TD error, $R[(d, i,), j]$ is the reward, $$\min_k Q[(d, j), k]$$

is the shortest time taken to move from the next node 'j' to the destination node 'd', and $Q[(d, i), j]$ is the Q value of the transit edge.

Hereinafter, the amount of change in the Q values of the target edges will be described by an equation.

The amount of change in the Q values according to at least one embodiment of the present disclosure may be expressed as Equation 2.

$$\Delta Q[(d, l), m] = \quad \text{Equation 2}$$
$$\{R[(d, i), j] + \min_k Q[(d, j), k] - Q[(d, i), j]\}\lambda_1^{\Phi(j,l,m)/\lambda_2}$$

In Equation 2, $\Delta Q$ is the amount of change in the Q value, 'R' is the reward, $$\min_k Q[(d, j), k]$$

is the shortest time taken to move from the next node 'j' to the destination node 'd', 'Q' is the Q value, ϕ is the standard movement time, $\lambda_1$ and $\lambda_2$ are decaying factors. 'l' and 'm' refer to two adjacent nodes among the nodes included in the target edges. 'i' is the current node, 'j' the next node, and 'd' the destination node.

When a single vehicle is present on the track involving no interference with other vehicles, ϕ(j, l, m) means the standard movement time taken for the single vehicle to move through nodes and cm' to node 'j'.

Q[(d, l), m] is a Q value which is the time taken for the vehicle to move through the target edge including nodes and 'm' to node 'd'.

R[(d, i), j] denotes a reward for an act of moving a vehicle assigned node 'd' as the destination from node 'i' to node 'j'.

$$\{R[(d, i), j] + \min_k Q[(d, j), k] - Q[(d, i), j]\}$$

is a TD error for the transit edges to update the target edges.

$\lambda_1$ and $\lambda_2$ are parameters used for differentially updating the Q values of the target edges according to the distances between the target edges and the transit edge. Preferably, $\lambda_1$ is a real number between 0 and 1, and $\lambda_2$ is a real number greater than 0.

Finally, the update of the Q values may be expressed as Equation 3.

$$Q[(d,l),m] \leftarrow Q[(d,l),m] + \alpha \Delta Q[(d,l),m] \quad \text{Equation 3}$$

FIG. 5B shows a D node 550, a first node 551, a second node 552, and a third node 553. The following describes, for moving the vehicle from the first node 551 to the D node 550, the first reward for an act of the vehicle moving from the first node 551 to the D node 550 and the second reward for an act of the vehicle moving from the first node 551 to the second node 552. Here, the rewards are used to update the Q table, and the larger the reward, the larger the amount of change in the Q values. The following further compares between cases of using and not using the reward shaping determined according to at least one embodiment of the present disclosure.

In FIG. 5B, A(d, i) denotes a set of adjacent nodes that a vehicle can move along from node 'i' in a way to move to node 'd'. t(i, j) is a measure of the time taken for the vehicle to travel from node 'i' to node 'j'. ϕ(i, j) is the time taken for a single vehicle when present alone on the track to move from node 'i' to node 'j', and it denotes a potential. Potential is a value that does not change over time.

An action for the vehicle to take at the first node 551 may be a movement to the D node 550 or a movement to the second node 552. The time for the vehicle to arrive at the D node 550 through the second node 552 takes longer than the time for the vehicle to move straight to the D node 550.

When the dynamic routing apparatus moves the vehicle from the first node 551 to the D node 550, the first reward is t(1,D)−4. t(1,D) is a time obtained by measuring the movement of the vehicle, namely, a transit time, and −4 is a potential difference between the first node 551 and the D node 550. Specifically, Φ(D,D)−Φ(D,1)=0−4=−4.

On the other hand, when the dynamic routing apparatus moves the vehicle from the first node 551 to the second node 552, the second reward is t(1,2)+1. t(1,2) is a time obtained by measuring the vehicle movement, that is, a transit time, and +1 is a potential difference between the first node 551 and the second node 552. Specifically, Φ(D,2)−Φ(D,1)=5−4=1.

The first reward and the second reward as compared may exhibit that the first reward is determined to be a value smaller by 4 than the actual transit time, and the second reward is determined to be a value larger by 1 than the actual transit time. Depending on the magnitude of the two rewards, the amount of change in the Q values also varies.

With the first reward, since the vehicle has moved closer to the destination, the first reward time is determined to be smaller than the actual transit time, which means that the amount of change in the Q values is also smaller than that of the second reward. On the other hand, with the second reward, since the vehicle has moved farther from the destination, the second reward time is determined to be larger than the actual transit time, which means that the amount of change in the Q values is also larger than that of the first reward. In other words, the second reward is larger than the first reward, which means that the amount of change in the Q values due to the second reward is also larger than that due to the first reward.

As a result, the dynamic routing apparatus updates the Q values based on the actual transit time, and in doing so, it can optimize the Q values efficiently by adjusting the actual transit time with incentives and penalties.

Therefore, rendering the vehicle to move along a node that takes a long time to move the vehicle to the destination node is given a large reward value. On the other hand, a small reward value is provided when causing the vehicle to move along a node that takes a short time taken for the vehicle to move to the destination node.

Further, the reward according to at least one embodiment of the present disclosure is shaped by the potential. The dynamic routing apparatus can optimize the Q values by using the reward shaped based on the potential. This is more efficient than the case where no potential is used.

Reward shaping may be expressed as in Equation 4.

$$R[(d,i),j]=l(i,j)+\rho[\gamma\varphi(d,j)-\varphi(d,i)] \quad \text{Equation 4}$$

In Equation 4, γ is a discount factor, and p is an arbitrary value determined empirically.

Figure 6A:
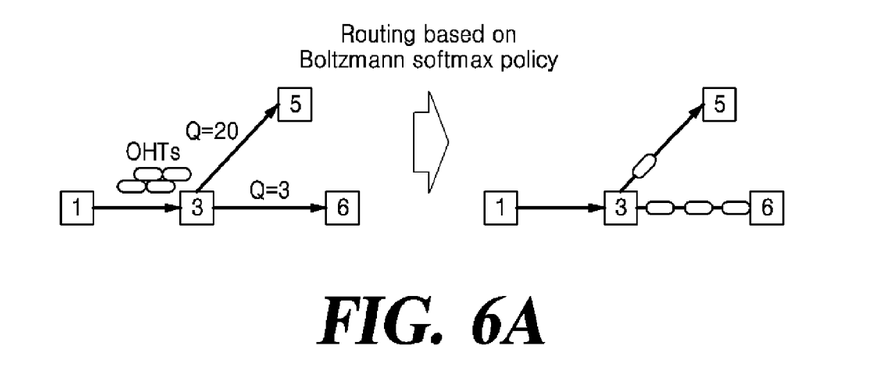
FIGS. 6A and 6B are diagrams illustrating Boltzmann softmax policy used for routing according to some embodiments of the present disclosure.
Figure 6B:
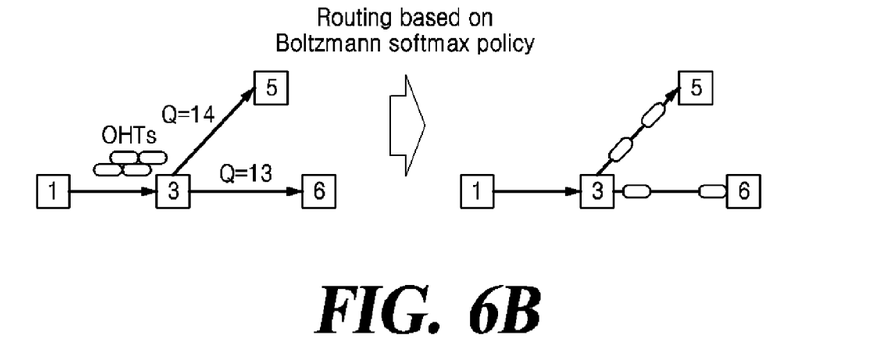

FIGS. 6A and 6B are diagrams illustrating the Boltzmann softmax policy used for routing according to some embodiments of the present disclosure.

As shown in FIGS. 6A and 6B, the dynamic routing apparatus moves a plurality of vehicles from node 3 to node 5 or node 6. At this time, the dynamic routing apparatus selects by probability either node 5 or node 6 according to the Boltzmann softmax policy.

In FIG. 6A, when the Q value of the edge between node 3 and node 5 is 20 and the Q value of the edge between node 3 and node 6 is 3, the probability that the dynamic routing apparatus moves the vehicle to node 5 is smaller. Conversely, the dynamic routing apparatus has a higher probability of moving the vehicle to node 6.

In FIG. 6B, when the Q value of the edge between node 3 and node 5 is 14, and the Q value of the edge between node 3 and node 6 is 13, the probability that the dynamic routing apparatus moves the vehicle to node 5 is similar to that it moves the vehicle to node 6.

The determination of the next node according to the Boltzmann softmax policy may be expressed as Equation 5 and Equation 6.

$$\pi(j \mid (d, i)) = \frac{e^{-\frac{1 Q[(d,i),j]}{\overline{Q}(d,i)}}}{\Sigma_{k \in A(d,i)} e^{-\frac{1 Q[(d,i),k]}{\overline{Q}(d,i)}}} \quad \text{Equation 5}$$

$$\overline{Q}(d, i) = \frac{\Sigma_{j \in A(d,i)} Q[(d, i), j]}{|A(d, i)|} \quad \text{Equation 6}$$

In Equation 5, π(j|(d,i) represents the probability that the dynamic routing apparatus renders the vehicle about to move from node 'i' to node 'd' to be shifted to node 'j'. Further, in Equations 5, τ is a temperature parameter that is used for adjusting an exploration-exploitation balance. When the temperature parameter value is large, the probability gap that the vehicle will move to each node decreases, which is referred to as exploration. Conversely, when the temperature parameter value is small, the probability gap that the vehicle will move to each node increases, which is called exploitation.

According to the aforementioned Boltzmann softmax policy, the dynamic routing apparatus can prevent traffic congestion than when using a greedy policy.

The above-described process relates to a process of selecting a node to which the vehicle will move when there is a plurality of next nodes to the current node where the vehicle is located. This is called routing.

Figure 7:
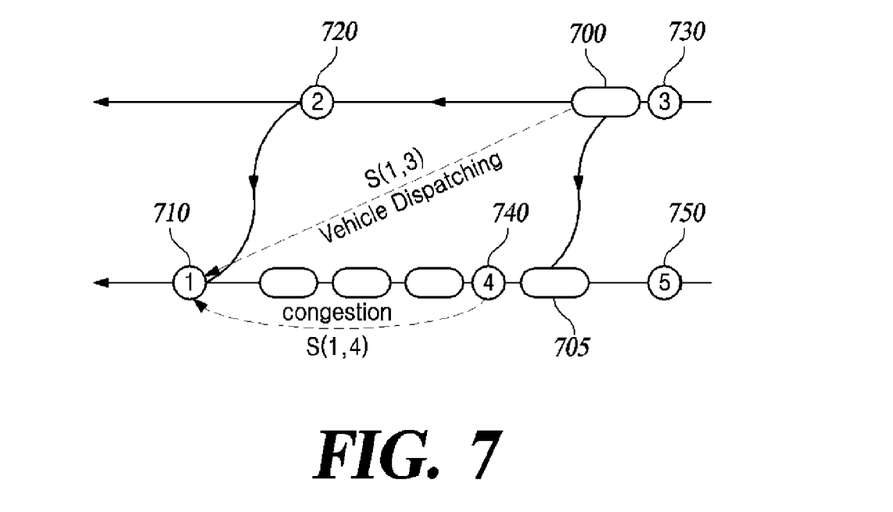
FIG. 7 is a diagram illustrating a process of allocating vehicles based on a Q table according to at least one embodiment of the present disclosure.

FIG. 7 is a diagram illustrating a process of allocating a vehicle based on a Q table according to at least one embodiment of the present disclosure.

FIG. 7 shows a first vehicle 700, a second vehicle 705, a first node 710, a second node 720, a third node 730, a fourth node 740, and a fifth node 750. When a vehicle allocation is requested from the first node 710, the dynamic routing apparatus allocates a vehicle that takes the least time to reach the first node 710.

The dynamic routing apparatus utilizes the Q table as a basis for calculating the estimated time S(1,3) for the first vehicle 700 to reach the first node 710 and the estimated time S(1,4) for the second vehicle 705 to reach the first node 710. Since the estimated time S(1,3) is shorter than S(1,4) due to the traffic congestion between the first node 710 and the fourth node 740, the dynamic routing apparatus moves the first vehicle 700 to the first node 710.

The above-described process is referred to as dispatching.

Figure 8:
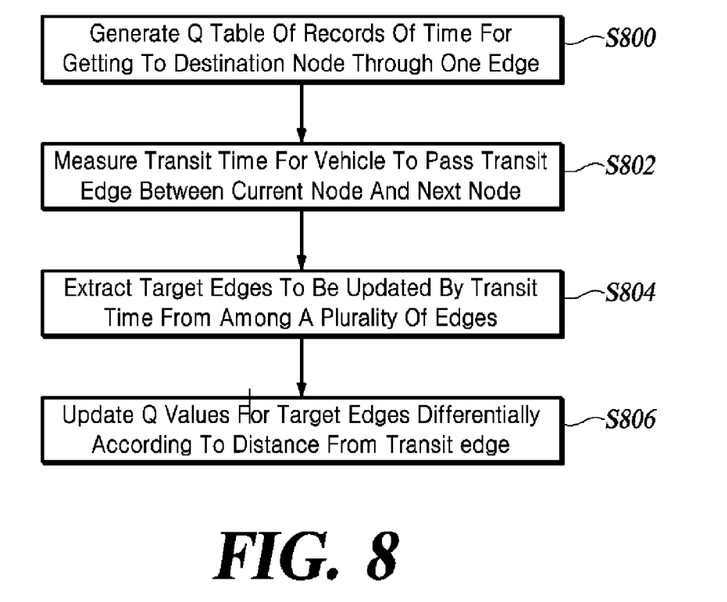
FIGS. 8 and 9 are flowcharts of methods of operating a dynamic routing apparatus according to some embodiments of the present disclosure.
Figure 9:
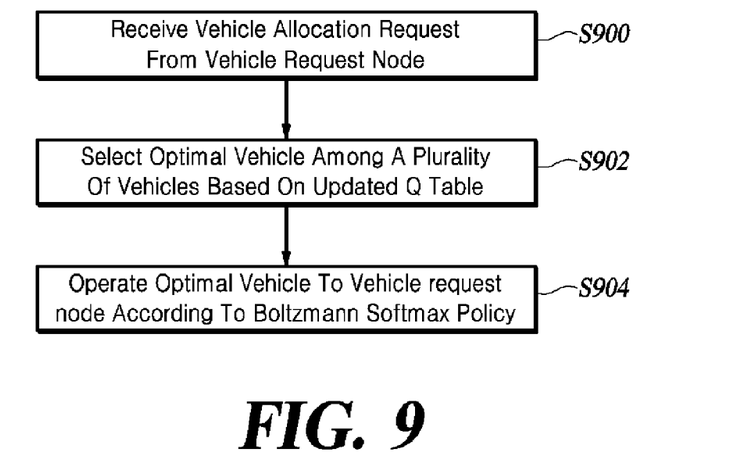

FIGS. 8 and 9 are flowcharts of methods of operating a dynamic routing apparatus according to some embodiments of the present disclosure.

As shown in FIG. 8, the dynamic routing apparatus generates a Q table of records of the time taken to arrive at a destination node through one edge (S800).

The Q-table generation unit 200 may initialize the Q table. The Q-table generation unit 200 sets all Q values to 0. In a no-congestion situation in the OHT system, a vehicle assigned a destination node passes through an edge between one node and an adjacent node, and the measurement unit 210 measures the transit time. Here, the no-congestion situation means that there is a single vehicle alone in the OHT system. The Q-table generation unit 200 calculates the shortest movement time taken for the vehicle to move from the adjacent node to the destination node based on the Q table. Thereafter, the Q-table generation unit 200 updates the Q value based on the transit time and the shortest movement time. The Q-table generation unit 200 may perform initialization for all Q values until a difference between a Q value before the update and a Q value after the update becomes smaller than a preset value. Through this process, the Q-table generation unit 200 may perform an initialization operation for all Q values by performing an initialization operation for all edges and all destination nodes.

The dynamic routing apparatus measures the transit time of the vehicle when it passes through the transit edge between the current node and the next node (S802).

The dynamic routing apparatus extracts target edges to be updated according to the transit time from among a plurality of edges (S804).

The dynamic routing apparatus extracts, from the plurality of edges, remaining edges as the target edges, excluding all of the transit edge and such edges that can be used for the vehicle to move from the next node to the destination node.

The dynamic routing apparatus differentially updates the Q values for target edges according to distances to the transit edge (S806).

The dynamic routing apparatus may differentially update the Q values partially based on the transit time while adjusting the Q values so that an amount of change in a Q value of a target edge that is closer to the transit edge is greater than an amount of change in a Q value of a target edge that is farther from the transit edge.

Additionally, the dynamic routing apparatus may differentially update the Q values by applying the reward or TD errors at a lesser degree in the Q values as the distances to the transit edge increase.

As shown in FIG. 9, the dynamic routing apparatus receives a request for vehicle allocation from a vehicle request node (S900).

The dynamic routing apparatus selects an optimal vehicle from among a plurality of vehicles based on the updated Q table (S902).

The dynamic routing apparatus calculates estimated movement times for the plurality of vehicles to move to the vehicle request node, respectively, based on the updated Q table, and it selects, from the plurality of vehicles, a vehicle with the shortest estimated movement time as the optimal vehicle. The selected vehicle is an optimal vehicle for transporting a wafer lot.

The dynamic routing apparatus transports the optimal vehicle to the vehicle request node according to the Boltzmann softmax policy (S904). The vehicle request node becomes a destination of the optimal vehicle.

Here, the Boltzmann softmax policy prescribes that, when there is a plurality of routing edges connected to a node where the optimal vehicle is located, the optimal vehicle be moved through one routing edge of the plurality of routing edges based on the probability according to the ratio of the Q values to the plurality of routing edges.

Although Steps S800 to S904 in FIGS. 8 and 9 are described to be sequentially performed, they merely instantiate the technical idea of some embodiments of the present disclosure. Therefore, a person having ordinary skill in the pertinent art could incorporate various modifications, additions, and substitutions in practicing the present disclosure by changing the sequences described by FIGS. 8 and 9 or by performing one or more of Steps S800 to S904 in parallel, without departing from the gist and the nature of the at least one embodiment of the present disclosure, and hence the steps in FIGS. 8 and 9 are not limited to the illustrated chronological sequences.

The steps illustrated in FIGS. 8 and 9 can be implemented as computer-readable codes on a computer-readable recording medium. The computer-readable recording medium includes any type of recording device on which data that can be read by a computer system are recordable. Examples of the computer-readable recording medium include non-transitory medium such as a ROM, a RAM, a CD-ROM, a magnetic tape, a floppy disk, and an optical data storage and transitory medium such as a carrier wave (e.g., transmission through the Internet) and data transmission medium. Further, the computer-readable recording medium can be distributed in computer systems connected via a network, wherein the computer-readable codes can be stored and executed in a distributed mode.

As described above, at least one embodiment of the present disclosure can update the Q table based on real-time data whenever the OHT vehicle moves along one edge, and speed up the computation required for updating the Q table by utilizing local adaptation and decaying update.

Another embodiment of the present disclosure can respond in real-time to a failure of an OHT vehicle, a congested route, or an OHT vehicle allocation request that is difficult to predict by using the Q table being updated based on real-time data.

Yet another embodiment of the present disclosure provides an OHT system which assigns an idle OHT vehicle located near the relevant node based on the Q table upon receiving an OHT vehicle allocation request, thereby allowing the OHT vehicle to quickly arrive at the relevant node.

At least one of the units, components, elements or modules (collectively "units" in this paragraph) represented by a block in the drawings such as FIG. 2 may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

Yet another embodiment of the present disclosure can reduce an amount of calculation required for routing, by determining only the travel direction at each node based on the constantly updated Q table without setting the entire route of the OHT vehicle every time an OHT vehicle allocation request is received.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand the scope of the claimed invention is not to be limited by the above explicitly described embodiments but by the claims and equivalents thereof.

What is claimed is:

1. A dynamic routing method for an overhead hoist transport (OHT) system, comprising:
generating a Q table in which at least one Q value is recorded, which is a time taken for a vehicle to move through an edge between two adjacent nodes to a node other than the two adjacent nodes;
measuring a transit time of the vehicle when assigned a destination node and passing a transit edge between a current node and a next node;
extracting target edges to be updated according to the transit time from among a plurality of edges; and
differentially updating Q values for the target edges according to distances to the transit edge based in part on the transit time, the Q values for the target edges being time values for the vehicle to move through the target edges to the destination node.

2. The dynamic routing method of claim 1, wherein the extracting of the target edges comprises:
extracting, from the plurality of edges, remaining edges as the target edges, excluding such edges that can be used for the vehicle to move from the next node to the destination node and excluding the transit edge.

3. The dynamic routing method of claim 1, wherein the differentially updating of the Q values for the target edges comprises:
differentially updating the Q values partially based on the transit time while adjusting the Q values so that an amount of change in a Q value of a target edge that is closer to the transit edge is greater than an amount of change in a Q value of a target edge that is farther from the transit edge.

4. The dynamic routing method of claim 1, wherein the differentially updating of the Q values for the target edges comprises:
calculating a first potential between the destination node and the current node and a second potential between the destination node and the next node;
calculating a difference between the first potential and the second potential;
determining a reward by adjusting the transit time by the difference;
calculating distances between the target edges and the transit edge; and
updating the Q values for the target edges based in part on the reward and the distances.

5. The dynamic routing method of claim 4, wherein the differentially updating of the Q values for the target edges comprises:
applying the reward at a lesser degree in the Q values as the distances to the transit edge increase.

6. The dynamic routing method of claim 4, wherein the differentially updating of the Q values for the target edges comprises:
calculating a movement time from the next node to the destination node based on the Q table;
calculating a temporal difference error based on the reward, the movement time, and a Q value of the transit edge; and
applying the temporal difference error in the Q values at a lesser degree as the distances to the transit edge increase.

7. The dynamic routing method of claim 1, wherein the generating of the Q table comprises:
setting all of the Q values included in the Q table to 0;
measuring a first transit time of a first vehicle when assigned a first destination node and passing a first edge between a current node and a next node;
calculating, based on the Q table, a shortest movement time for the first vehicle to move from the next node to the first destination node; and
setting a first Q value that is a movement time for the first vehicle to move through the first edge to the first destination node, based on the first transit time and the shortest movement time.

8. The dynamic routing method of claim 1, further comprising:
receiving a request for vehicle allocation from a vehicle request node;
selecting an optimal vehicle from among a plurality of vehicles based on an updated Q table; and
moving the optimal vehicle to the vehicle request node according to a Boltzmann softmax policy.

9. The dynamic routing method of claim 8, wherein the Boltzmann softmax policy comprises:
when there is a plurality of routing edges connected to a node where the optimal vehicle is located, moving the optimal vehicle through one routing edge of the plurality of routing edges based on a probability according to a ratio of the Q values to the plurality of routing edges.

10. The dynamic routing method of claim 8, wherein the selecting of the optimal vehicle comprises:
calculating estimated movement times for the plurality of vehicles to move to the vehicle request node, respectively, based on the updated Q table; and
selecting a vehicle with a shortest estimated movement time among the plurality of vehicles as the optimal vehicle.

11. A dynamic routing apparatus for an overhead hoist transport (OHT) system, comprising at least one processor configured to implement:
a Q-table generation unit configured to generate a Q table in which at least one Q value is recorded, which is a time taken for a vehicle to move through an edge between two adjacent nodes to a node other than the two adjacent nodes;
a measuring unit configured to measure a transit time of the vehicle when assigned a destination node and passing a transit edge between a current node and a next node;
a target-edge extracting unit configured to extract target edges to be updated according to the transit time from among a plurality of edges; and
a Q-table management unit configured to differentially update Q values for the target edges according to distances to the transit edge based in part on the transit time, the Q values for the target edges being time values for the vehicle to move through the target edges to the destination node.

12. The dynamic routing apparatus of claim 11, wherein the target-edge extracting unit is configured to extract, from the plurality of edges, remaining edges as the target edges, excluding such edges that can be used for the vehicle to move from the next node to the destination node and excluding the transit edge.

13. The dynamic routing apparatus of claim 11, wherein the Q-table management unit is configured to differentially update the Q values partially based on the transit time while adjusting the Q values so that an amount of change in a Q value of a target edge that is closer to the transit edge is greater than an amount of change in a Q value of a target edge that is farther from the transit edge.

14. The dynamic routing apparatus of claim 11, wherein the Q-table management unit is configured to:
calculate a first potential between the destination node and the current node and a second potential between the destination node and the next node;

calculate a difference between the first potential and the second potential;

determine a reward by adjusting the transit time by the difference;

calculate distances between the target edges and the transit edge; and update the Q values for the target edges based in part on the reward and the distances.

15. The dynamic routing apparatus of claim 14, wherein the Q-table management unit is configured to apply the reward at a lesser degree in the Q values as the distances to the transit edge increase.

16. The dynamic routing apparatus of claim 14, wherein the Q-table management unit is configured to:

calculate a movement time from the next node to the destination node based on the Q table;

calculate a temporal difference error based on the reward, the movement time, and a Q value of the transit edge; and apply the temporal difference error in the Q values at a lesser degree as the distances to the transit edge increase.

17. The dynamic routing apparatus of claim 11, wherein the measuring unit is configured to measure a first transit time of a first vehicle when assigned a first destination node and passing a first edge between a current node and a next node, and wherein the Q-table generation unit is configured to:

set all of the Q values included in the Q table to 0;

calculate, based on the Q table, a shortest movement time for the first vehicle to move from the next node to the first destination node; and set a first Q value that is a movement time for the first vehicle to move through the first edge to the first destination node, based on the first transit time and the shortest movement time.

18. The dynamic routing apparatus of claim 11, wherein the processor is further configured to implement:

a receiving unit configured to receive a request for vehicle allocation from a vehicle request node;

a vehicle selection unit configured to select an optimal vehicle from among a plurality of vehicles based on an updated Q table; and a vehicle control unit configured to move the optimal vehicle to the vehicle request node according to a Boltzmann softmax policy.

19. The dynamic routing apparatus of claim 18, wherein the Boltzmann softmax policy comprises:

when there is a plurality of routing edges connected to a node where the optimal vehicle is located, moving the optimal vehicle through one routing edge of the plurality of routing edges based on a probability according to a ratio of the Q values to the plurality of routing edges.

20. The dynamic routing apparatus of claim 18, wherein the vehicle selection unit is configured to:

calculate estimated movement times for the plurality of vehicles to move to the vehicle request node, respectively, based on the updated Q table; and select a vehicle with a shortest estimated movement time among the plurality of vehicles as the optimal vehicle.

* * * * *